United States Patent

Batchelor et al.

[11] Patent Number: 5,821,813
[45] Date of Patent: Oct. 13, 1998

[54] BIDIRECTIONAL AMPLIFIER

[75] Inventors: Robert Alexander Batchelor, St Ives; John William Archer, Pennant Hills, both of Australia

[73] Assignee: Commonwealth Scientific & Industrial Research Organisation, Campbell, Australia

[21] Appl. No.: 647,815

[22] Filed: May 15, 1996

[30] Foreign Application Priority Data

Nov. 16, 1993 [AU] Australia .................................. PM2445

[51] Int. Cl.$^6$ .............................. H03F 3/193; H03F 3/62
[52] U.S. Cl. ........................... 330/277; 330/293; 330/294
[58] Field of Search ................................... 330/277, 293, 330/294; 455/74, 78, 84

[56] References Cited

U.S. PATENT DOCUMENTS

| | | |
|---|---|---|
| 3,519,765 | 7/1970 | Huber . |
| 4,456,889 | 6/1984 | Kumar .................................. 330/277 X |
| 4,760,350 | 7/1988 | Ayasli ..................................... 330/277 |
| 5,006,823 | 4/1991 | Baril et al. . |
| 5,027,084 | 6/1991 | Tsukii . |
| 5,046,155 | 9/1991 | Beyer et al. . |
| 5,057,791 | 10/1991 | Thompson et al. ...................... 330/277 |
| 5,064,140 | 11/1991 | Pittman et al. . |
| 5,084,637 | 1/1992 | Gregor . |
| 5,105,166 | 4/1992 | Tsukii et al. . |

FOREIGN PATENT DOCUMENTS

| | | |
|---|---|---|
| 430509 | 6/1991 | European Pat. Off. . |
| 725232 | 3/1955 | United Kingdom . |

OTHER PUBLICATIONS

Derwent Abstract Accession No. H 2261C/34, class U24, DS,A. 2917–275 (Siemens AG) 14 Aug. 1980.

Derwent Abstract Accession No. 85–010624/02, Class U24, Su,A, 1092704 (Nikkiten VE) 15 May 1994.

*Primary Examiner*—James B. Mullins
*Attorney, Agent, or Firm*—Cushman Darby & Cushman IP Group of Pillsbury Madison & Sutro LLP

[57] ABSTRACT

A bidirectional amplifier has first and second two-terminal ports each capable of acting as either an input or an output for said amplifier. A field effect type transistor is connected in common gate mode with the common (or grounded) terminal of each of said ports being at least AC connected with the gate of said transistor, and the source and drain of said transistor being respectively connected to a corresponding one of the other terminals of said ports via an impedance matching device.

17 Claims, 8 Drawing Sheets

FIG.14

BIDIRECTIONAL AMPLIFIER

This is a continuation of International Appln. No. PCT/AU94/00704 filed Nov. 16, 1994.

TECHNICAL FIELD

The present invention relates to bidirectional amplifiers and to transceivers incorporating bidirectional amplifiers, and to other systems employing two-way transfer of information.

BACKGROUND ART

A conventional transceiver normally has two separate amplifying paths one for transmit and one for receive. Each amplifying path includes, for example, a radio frequency amplifier as well as an intermediate frequency amplifier thus requiring the transceiver to have at least four amplifiers. If the amplifiers were able to be made bidirectional, then a substantial saving in transceiver complexity could be achieved.

Various field effect type transistors (hereafter identified by the generic class identifier of field effect transistor or FET) are known including the junction FET, MESFET, MOSFET, the HEMT (high electron mobility transistor) and the ballistic transistor. All of these devices have a theoretical inherent symmetry since it is theoretically possible for the source and drain to be interposed. However, in practice, such devices are not fabricated with symmetrical geometries in order that specific properties may be achieved. Further, the source terminal of such FETs is normally grounded and this again leads to a tendency for the inherent theoretical symmetry of a FET device to be overlooked. In addition, such devices are almost never used in a common gate configuration as an amplifier because that configuration is potentially unstable. Indeed, FET devices are normally only used in the common gate configuration as an oscillator because of the potential instability of this configuration.

Two prior art realizations of bidirectional amplifiers are described below with reference to FIGS. 3 and 4. The first makes use of four steering devices which are operated in pairs to allow two alternative signal paths, each of which passes through a single unidirectional amplifier. However, such steering devices are lossy and inefficient, and have with impedance matching problems. The second uses two switches to control the signal to pass through a selected one of two unidirectional amplifiers. Again, such switches are very lossy.

It is the object of the present invention to provide a bidirectional amplifier utilising at least one field effect type transistor connected in a common gate configuration.

DISCLOSURE OF INVENTION

In accordance with a first aspect of the present invention there is disclosed a bidirectional amplifier having first and second two-terminal ports each capable of acting as either an input or an output for said amplifier, wherein a field effect type transistor is connected in common gate mode with a first terminal of each of said ports being at least AC connected with a gate of said transistor, and the source and drain of said transistor being respectively connected to a corresponding one of the other terminals of said ports via an impedance matching device. Preferably negative feedback to the gate is provided.

Preferably, the arrangement of the impedance matching devices is symmetric.

If desired, two or more of the field effect type transistors can be connected in cascade and/or in parallel.

In accordance with a second aspect of the present invention a transceiver incorporating the abovementioned bidirectional amplifier is also disclosed.

BRIEF DESCRIPTION OF DRAWINGS

Embodiments of the present invention will now be described with reference to the drawings in which.

MODES FOR CARRYING OUT THE INVENTION

Although some of the embodiments of the invention described below make use of three terminal devices, the type of device used can readily be extended to active devices with more than three terminals, and, in particular, active devices with a source, drain, and two or more gate terminals (see FIG. 9). The device symmetry is maintained, permitting bidirectional operation. The advantages gained from using multiple-gate devices are: electronic control of the gain of the amplifier circuit by varying the voltage applied to one or more gate terminals; and reduction in the feedback capacitance between the gate closest to the source terminal and the drain electrode thus improving the potential for circuit stability in a single device implementation.

Figure 1:
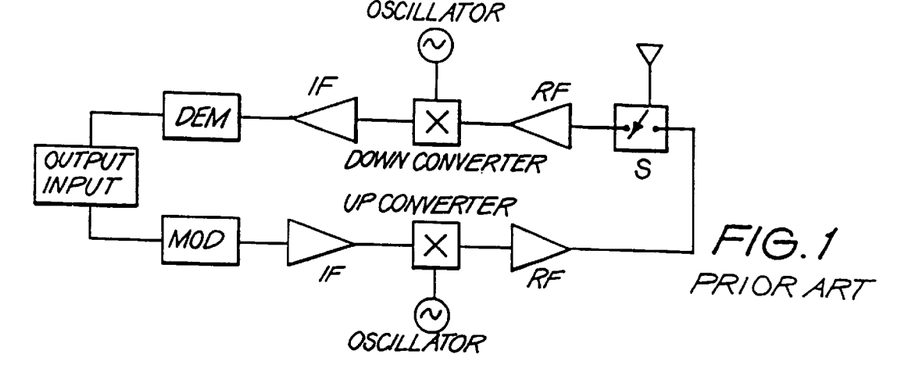
FIG. 1 is a schematic circuit diagram of a prior art transceiver utilizing unidirectional amplifiers.

As seen in FIG. 1, prior art transceivers require a separate receive amplification path (containing a demodulator DEM) and a separate transmit amplification path (containing a modulator MOD) and therefore are required to have a separate RF receive amplifier, a separate IF receive amplifier, a separate RF transmit amplifier and a separate IF transmit amplifier. The separate amplification paths in this example of a prior art transceiver, are connected to the antenna by means of a switch S so as to result in half-duplex operation. As a consequence, only half of the transceiver circuit is in use at any one time. In many transceivers, the paths of the circuit sitting idle are functionally identical to the paths in use.

Figure 2:
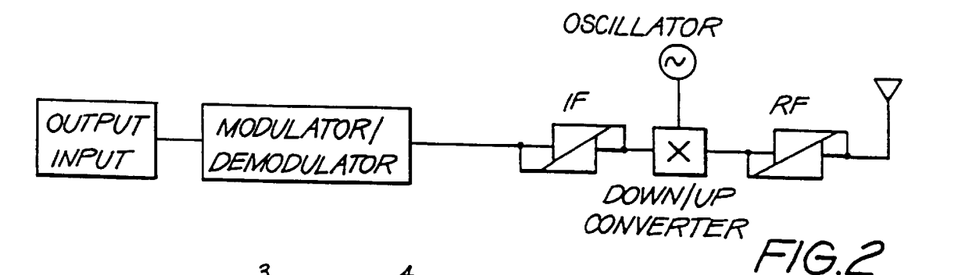
FIG. 2 is a schematic block diagram of a transceiver incorporating bidirectional amplifiers.

FIG. 2 illustrates a transceiver utilizing bidirectional amplifiers in which the transmit and receive amplification paths are combined and therefore all the components are always in use. Further the elimination of the front end switch S of FIG. 1 increases both receiver sensitivity and transmitted power.

Thus the potential advantages of utilizing bidirectional amplifiers in transceivers are as follows:

(a) a reduction, by a factor of possibly two or more, of the number of individual circuit functions, (b) a reduction, by a factor of possibly two or more, of the amount of semiconductor area utilized in integrated circuits, (c) a potential increase in receiver sensitivity due to the elimination of an input RF switch, (d) an increase in transmitted power (or an equivalent reduction in the power handling requirement of the transmitter) again due to the elimination of an output RF switch, and (e) a reduction, by a factor of possibly two or more, of the number of components in lumped element realizations.

Figure 3:
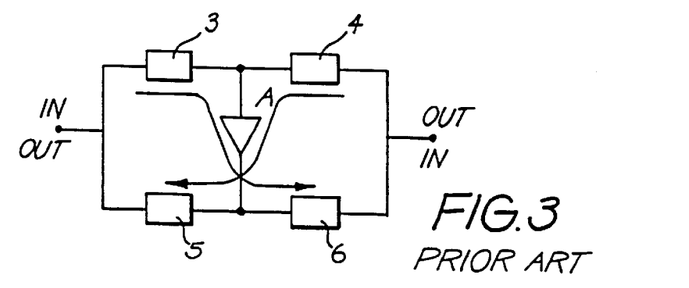
FIG. 3 is a schematic diagram illustrating one prior art method of realizing a bidirectional amplifier utilizing a single uni-directional amplifier.

In FIG. 3, one prior art form of realizing a bidirectional amplifier utilizing a uni-directional amplifier A is illustrated. This circuit requires the use of four steering devices 3, 4, 5 and 6 which are conceptually analogous to the diodes of a full wave rectifying bridge. By switching on an appropriate pair of the four steering devices, and switching off the remaining pair of steering devices, the desired signal flow indicated by either one of the two arrows in FIG. 3 through the single amplifier A can be achieved. More sophisticated versions of this type of prior art realisation are illustrated in the drawings of Japanese Patent Application No. 52-041541 published 7 Nov., 1978 under No. 53-127220. Such steering devices, especially those which operate at very high frequencies, are very lossy and thus inefficient. There are also problems with impedance matching.

Figure 4:
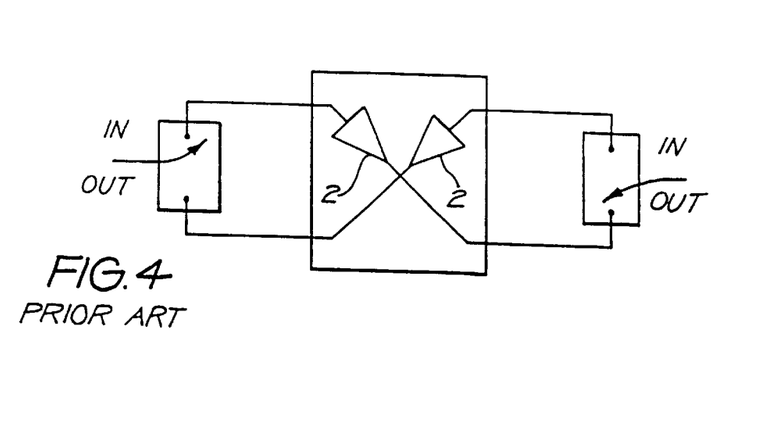
FIG. 4 is a schematic illustration of an alternative form of prior art bidirectional amplifier realized utilizing two uni-directional amplifiers.

In FIG. 4 an alternative prior art a bidirectional amplifier using two uni-directional amplifiers 2, is illustrated. Here two "ganged" switches are provided one in the input (output) and the other in the output (input). The switches are operated to steer the incoming signal to that amplifier of the pair of amplifiers having the correct orientation for the desired direction of signal transmission and amplification. A example of such prior art devices is to be seen in U.S. Pat. Nos. 5,027,084 and 5,105,166 both issued to Tsukii et al and assigned to Raytheon Company. Again such switches are very lossy.

It will be apparent to those skilled in the art that the above described prior art arrangements are not true bidirectional amplifiers since the direction of signal transmission and amplification through the actual amplifying device is the same in all instances.

Figure 5:
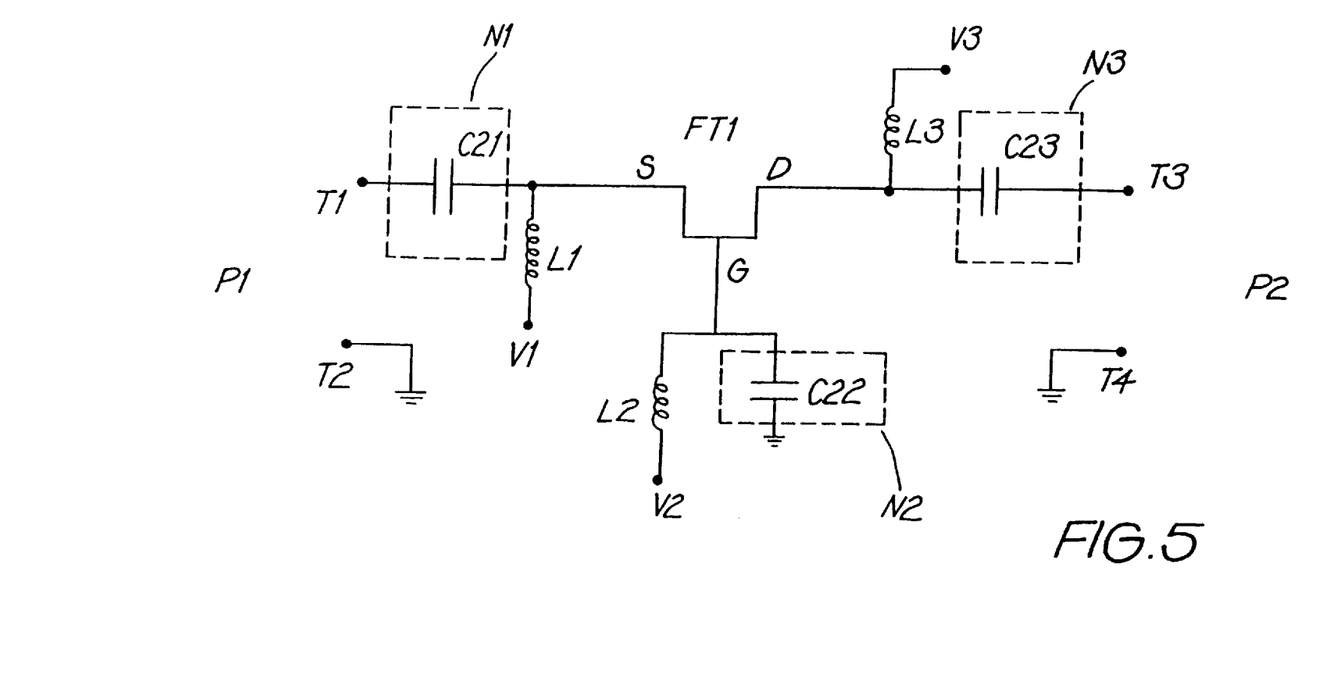
FIG. 5 is a schematic circuit diagram of a bidirectional amplifier circuit of a first embodiment.

The fundamental principle behind the present invention is illustrated in the first embodiment of FIG. 5. Here the bidirectional amplifier comprises a single field effect type transistor FT1 (as indicated above, the field effect transistor could be replaced with a multiple-gate electrode device without altering the functionality of the circuit) having a source S, drain D and gate G. The amplifier has a first port P1 having terminals T1 and T2 and a second port P2 having terminals T3 and T4. Terminals T2 and T4 are grounded. The field effect transistor FT1 is connected in common gate configuration with the gate G being connected to ground via a capacitor C22 (or other network N2) which provides negative feedback. An inductor L2 connects the gate G to a biasing potential V2.

The source S is connected to the terminal T1 via a capacitor C21 (or other network N1) and is provided with a DC bias voltage V1 via an inductor L1. Similarly, the drain D is connected to the terminal T3 via a capacitor C23 (or other network N3) and is also connected to a biasing voltage V3 by means of an inductor L3.

Preferably, the component values for L1, C21 (N1) and L3, C23 (N3) are selected to provide impedance matching between the input and output ports P1 and P2 and the field effect type transistor FT1. The capacitors C21 and C23 can be replaced by matching networks N1 and N3 respectively, as indicated by dotted lines in FIG. 5. The matching networks N1 and N3 are either identical or are switchable on change of amplification direction so as to be substituted for each other. Similarly, the feedback capacitor C22 can be replaced by a feedback network N2 as also indicated by dotted lines in FIG. 5.

In order to amplify in the left to right direction, that is with the port P1 comprising the input and the port P2 comprising the output, the voltage V1 is preferably set at a negative potential, the voltage V3 is set at a positive potential, and the voltage V2 is set at a voltage between these two voltages and preferably zero or ground potential. Thus current flows from drain to source and the input signal applied between terminals T1 and T2 is amplified and appears at the output between terminals T3 and T4.

The amplification can be made to operate in the opposite direction by maintaining the voltage at V2 but by switching the voltage at V1 to be a positive potential and the voltage at V3 to be a negative potential. This reverses the current flow in the transistor FT1 and also reverses the direction of amplification.

It will be apparent to those skilled in the art that the current handling capacity of the transistor FT1 can be increased by connecting two field effect transistors together in parallel so that the sources are connected together, the drains are connected together and the gates are connected together. It will also be apparent to those skilled in the art that the field effect transistor FT1 operates as a true bidirectional amplifier in that the direction of current flow and signal amplification is reversed through the same device.

Although in the above description the field effect type transistor is referred to as having a source terminal and drain terminal, since these terminals are entirely equivalent, it would be more consistent to refer to each of them as being a non-gate terminal.

Figure 6:
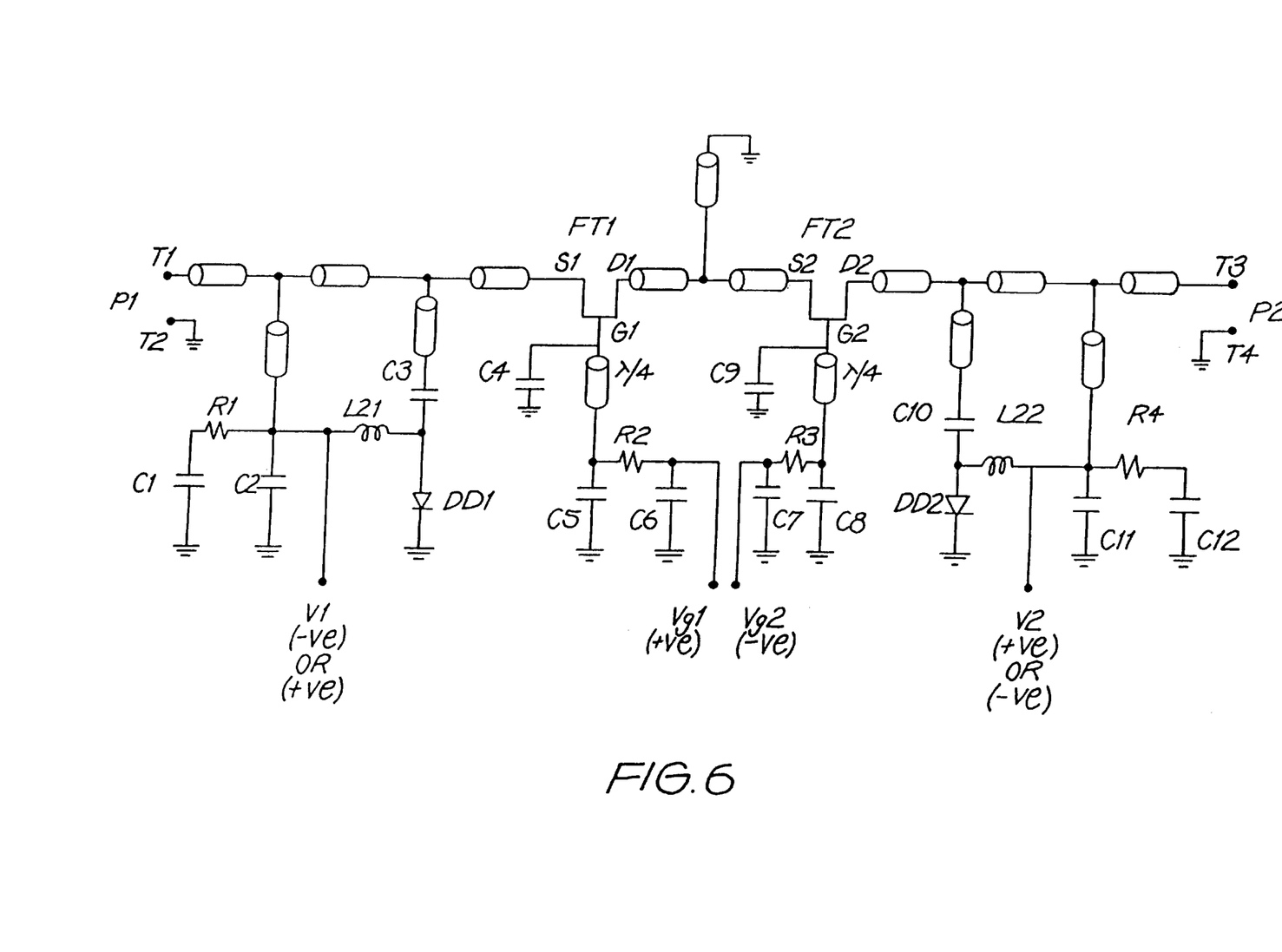
FIG. 6 is a schematic diagram of a bidirectional amplifier of a second embodiment.

Turning now to FIG. 6, a bidirectional amplifier incorporating two cascaded high electron mobility field effect type transistors (HEMT) implemented in micro-strip semi-insulating GaAs substrate with thickness ranging from 50–150 microns, and designed for a 5 GHz bandwidth in the 40–100 GHz frequency range, is illustrated in this drawing. The micro-strip transmission line elements are indicated as short lengths of "cylindrical cable" in order to indicate the distributed nature of these circuit elements. In addition, various stub transmission lines are indicated having specific purposes which will be discussed hereafter.

Each of the transistors FT1 and FT2 (again multiple-gate electrode devices could be substituted) has a gate G1 and G2 which is connected to ground via capacitors C4 and C9 respectively (representing an implementation of the feedback network N2 of FIG. 5) and a transmission line which is a quarter wavelength long at the design centre frequency (which is the equivalent of the inductor L2 of FIG. 5). These transmission lines are also used to bring a DC bias voltage, Vg1 and Vg2 respectively, to the gate terminals G1 and G2. The quarter wavelength transmission lines are by-passed to ground via the resistor and capacitor networks R2, C5 and C6 and R3, C8 and C7 respectively. These networks short-circuit the stub at in-band frequencies while simultaneously providing low frequency stabilization of the circuit by terminating the device in a small resistive value at frequencies well below the design range.

The drain D1 of transistor FT1 is connected to the source S2 of transistor FT2 by means of a symmetrical inter-stage transmission line network which includes a grounded stub. As well as providing impedance transformation between the two stages, this network also connects a DC ground potential to the drain D1 and source S2. This provides a DC reference point for the switching of the bias of the transistors. When the HEMT devices FT1 and FT2 are biased with symmetrical positive and negative drain-source supply voltages, reversal of circuit operation can be achieved by reversing the polarity of the supplies.

As will be apparent from FIG. 6, the source S1 is connected to a bias voltage V1 and the drain D2 is connected to a bias voltage V2. Each of these voltages is connected via a corresponding inductor L21 and L22 respectively to a corresponding diode DD1 and DD2 respectively. The diodes DD1 and DD2 are connected via corresponding capacitors C3 and C10 to further stub transmission lines which can be operated as either open circuit or short circuit tuning stubs depending upon the direction in which the amplifier is operating. The switching between open circuit and short circuit is achieved using the identical diodes DD1 and DD2. One of these diodes is forward biased, in the output circuit in order to create the short circuited stub, while the other is reverse biased, in the input circuit so as to create the open circuit stub.

The diode bias is conveniently switched when the power supply polarity is reversed to change the amplification direction. As a consequence, although the topology of the transmission line structures at input and output are identical, in use there is a significant difference in the source and load impedances presented to the series connected, or cascaded, HEMT devices. The diodes DD1 and DD2 permit the impedance matching networks to be substituted for each other when the direction of amplification is reversed. Typical voltages are V1=−3 or +3 volts, Vg1=−3.5 volts (or −0.5 volts), Vg2=−0.5 volts (or −3.5 volts) and V2=+3 or −3 volts.

This manipulation of the input and output circuits achieves highly desirable performance in that it gives high gain, a low input/output VSWR, and low noise, in each selected direction of operation.

In addition to the input/output circuit symmetry achieved with the above described circuit, circuit stability is also achieved, notwithstanding that grounded gate HEMT devices are inherently unstable. This instability arises because the output, or drain terminal, of the device presents a negative impedance to the external circuitry over a wide range of input source impedances.

In the circuit of FIG. 6, two techniques have been employed to stabilize the circuit while maintaining useful forward gain. These techniques are the series, or cascade, interconnection of a pair of HEMT devices as the gain element, and the use of capacitive feedback in series with the gate terminal of each of the HEMT devices. The capacitive feedback in the gate circuit tends to reduce or eliminate the negative resistance behavior of the HEMT output circuit. In addition, the capacitive feedback also reduces the overall gain of the circuit. By cascading together two HEMT devices, configured as common-gate with identical series capacitive feedback so that the drain of one device is coupled to the source of the other by a suitable, symmetric, impedance transforming network, it is possible to simultaneously achieve a high degree of circuit stability and high forward gain.

This result is achieved because the negative feedback and interstage impedance transformation permit an impedance to be presented to the second HEMT device in the series or cascade connection which results in positive values for its output impedance over a wide frequency range and for a wide range of source impedances at the input terminals of the cascaded or combined HEMT devices.

Figure 7:
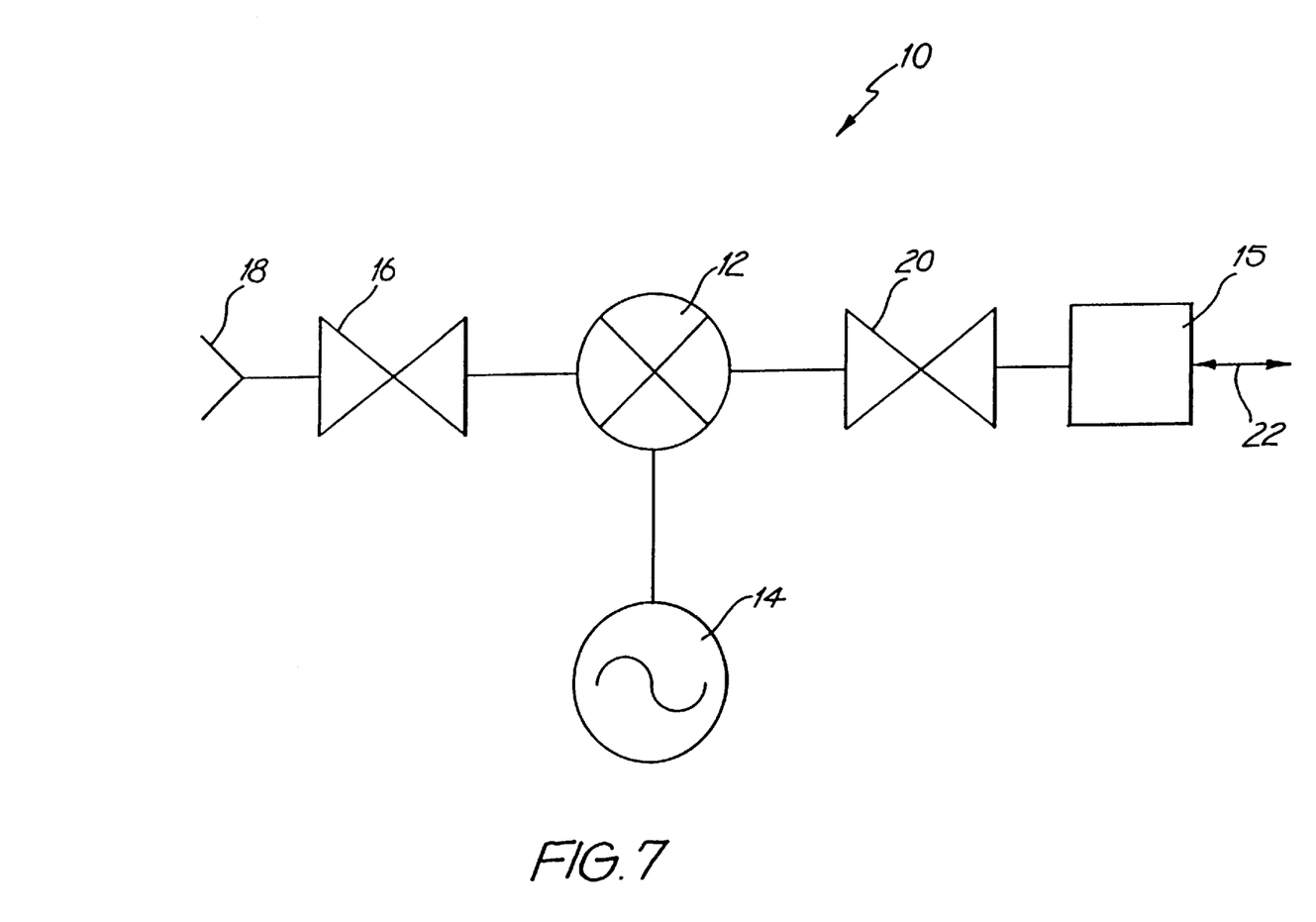
FIG. 7 is a schematic diagram of a bidirectional transceiver incorporating two bidirectional amplifiers.

FIG. 7 shows a transceiver 10 incorporating two bidirectional amplifiers of the type described above. The transceiver also comprises an up/down converting mixer 12 coupled to a local oscillator 14, and conventional electronic circuitry 15 adapted to perform modulation and demodulation of signals, and signal processing. The first bidirectional amplifier 16 is an RF amplifier and is located between the mixer 12 and an antenna 18. The second bidirectional amplifier 20 is an IF amplifier and is located between the mixer 12 and electronic circuitry 15. The electronic circuitry 15 receives and transmits data, for example from an antenna (not shown) and to a data terminal (also not shown), as indicated at 22.

A bidirectional amplifier of the type described also has application as a repeater in a time-division duplex communication system. In these systems such repeaters could be used, for example, to extend the range of medium and short wave personal communications networks.

Figure 8:
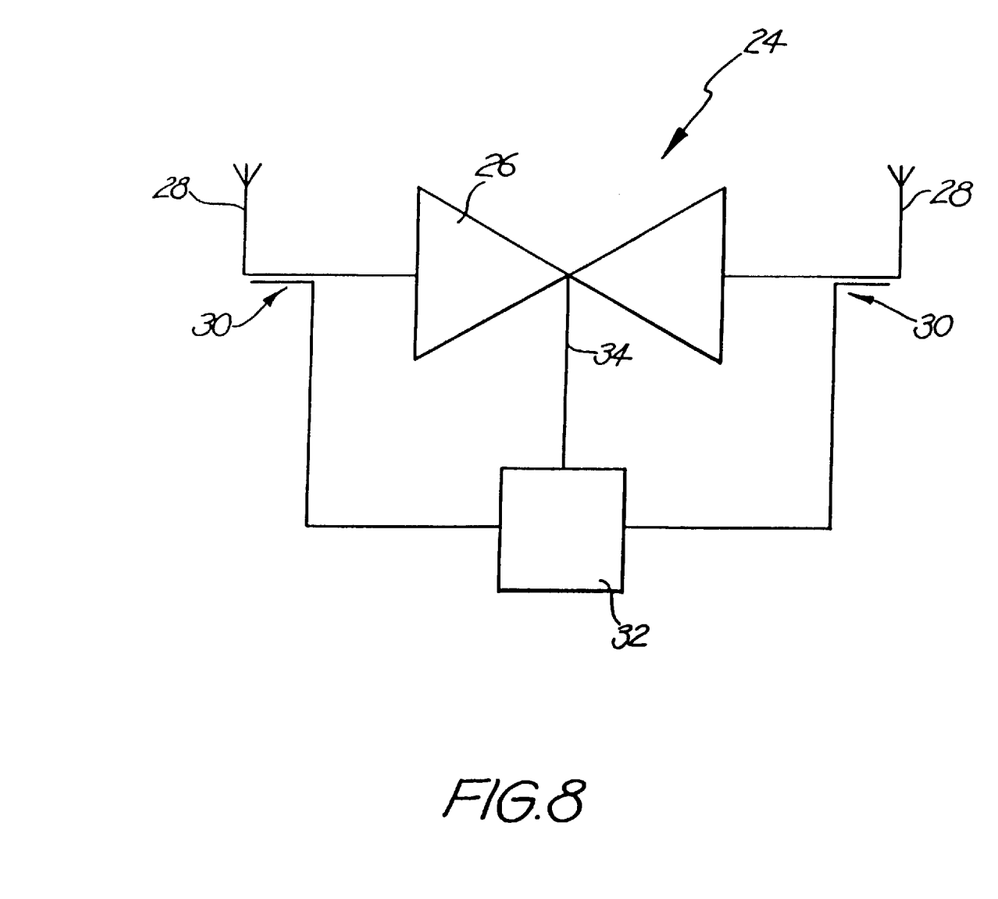
FIG. 8 shows a repeater incorporating a bidirectional amplifier.

FIG. 8 is a schematic diagram showing a repeater 24 comprising a bidirectional amplifier 26. The bidirectional amplifier 26 is connected between two antennae 28, which are coupled by couplers 30 to a directional switching control 32, which is itself connected to the bidirectional amplifier 26 at 34.

Figure 9:
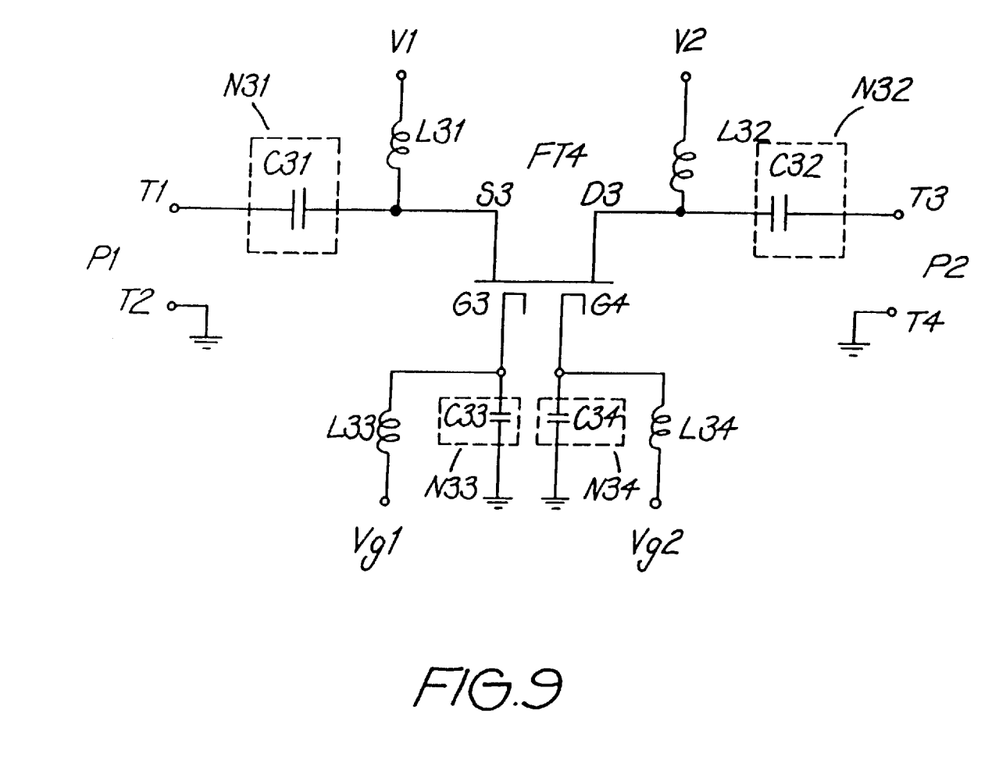
FIG. 9 is a schematic diagram of a bidirectional amplifier incorporating a dual gate FET.

FIG. 9 is a schematic diagram showing how the circuit of FIG. 5 can be adapted to incorporate a dual gate FET FT4. The gate circuit capacitors C33 and C34 are identical, as are the inductors L33 and L34, which are connected to DC gate biasing voltages Vg1 and Vg2. The capacitors C33 and C34 are connected to the two gates G3 and G4 of the dual gate FET FT4 respectively. The capacitors C31, C32, C33 and C34 of the circuit of FIG. 9 can be replaced by suitable matching networks N31, N32, N33 and N34 respectively.

The capacitors C31 and C32 (or matching networks N31 and N32) are identical (or switchable upon changing direction).

Typical supply voltages when amplifying from left to right, that is, from P1 to P2, are: V1=0 volts; V2=+3 volts; Vg1=−0.5 volts; and Vg2 is variable between −0.5 volts and +1 volt. Varying the voltage on the second gate G4 varies the amplifier gain without significant change in frequency response.

Typical supply voltages when amplifying from right to left, that is, from P2 to P1, are: V1=+3 volts; V2=0 volts; Vg2=−0.5 volts; and Vg1 is variable between −0.5 volts and +1 volt. Varying Vg1, again, controls the amplifier gain.

Figure 10:
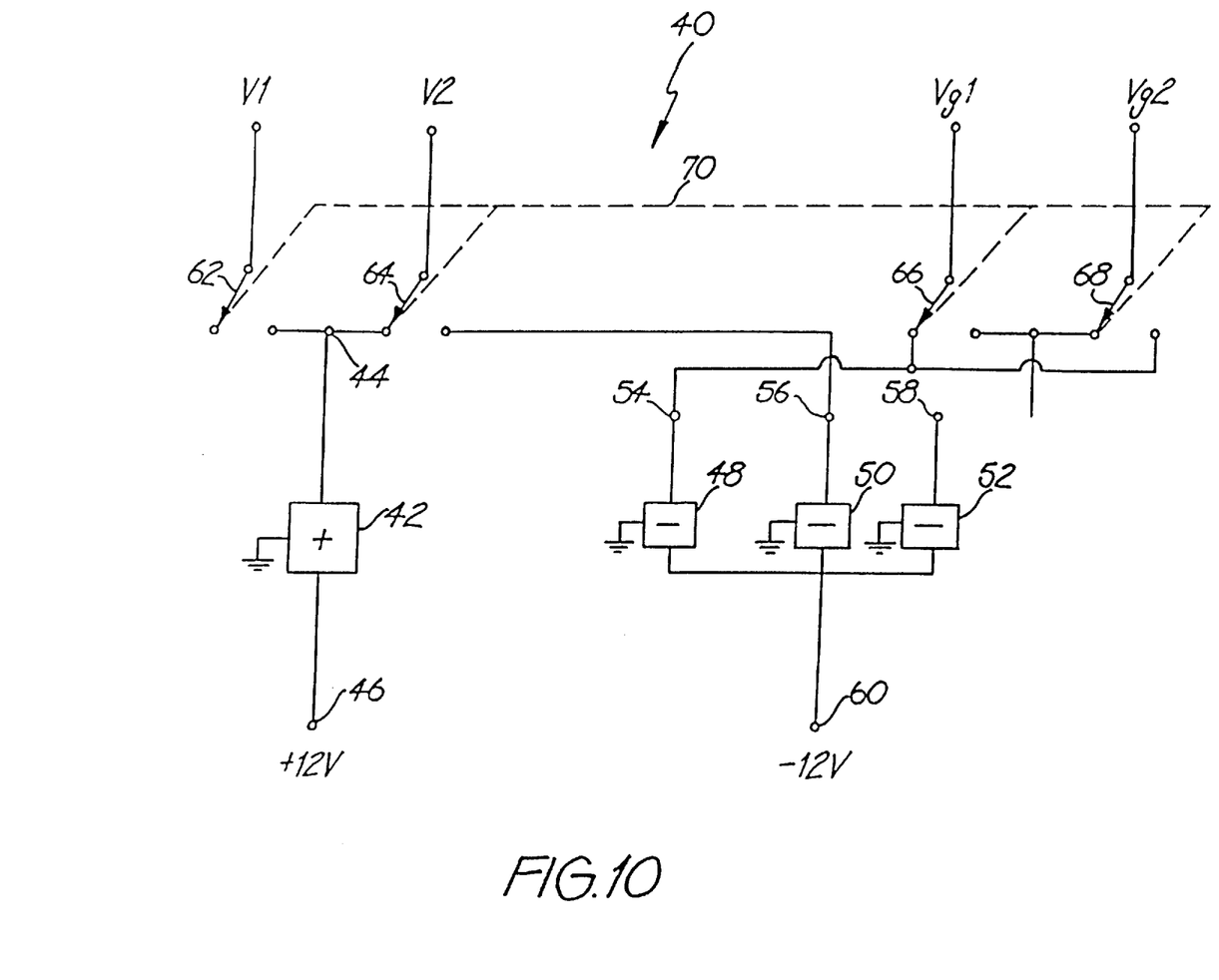
FIG. 10 shows a bias switching network for controlling the bias voltages of the circuit of FIG. 6.

FIG. 10 shows a bias switching network 40 for controlling the DC bias voltages V1, V2, Vg1 and Vg2 of the circuit of FIG. 6. The switching network 40 uses a positive voltage regulator 42 to provide a regulated output of +3 volts (i.e. at the point 44) from a positive supply voltage (at point 46) of +12 volts. In addition, three negative voltage regulators 48, 50 and 52 provide regulated output voltages of −3.5 volts, −3 volts, and −0.5 volts respectively (i.e. at the points 54, 56 and 58 respectively) from a −12 volt supply at point 60. Four single-pole double-throw switches 62, 64, 66 and 68, which can be actuated either mechanically or electrically, are arranged as shown in FIG. 10, and are ganged together as indicated by dotted lines 70 so as to operate in unison. Typical bias voltages when amplifying from left to right, that is, from P1 to P2, are: V1=−3 volts; V2=+3 volts; Vg1=−3.5 volts; and Vg2=−0.5 volts. Typical bias voltages when amplifying from right to left, that is, from P2 to P1, are: V1=+3 volts; V2=−3 volts; Vg1=−0.5 volts; and Vg2=−3.5 volts.

Figure 11:
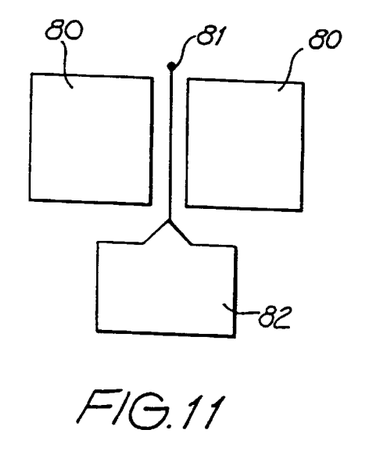
FIGS. 11 to 14 are each a plan view of the metallisation pattern of FET devices useful with the abovementioned embodiments.
Figure 12:
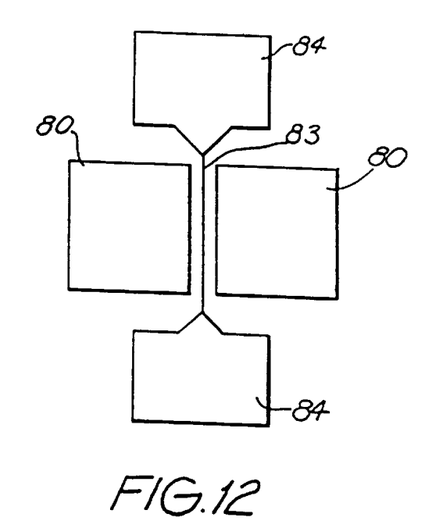
Figure 13:
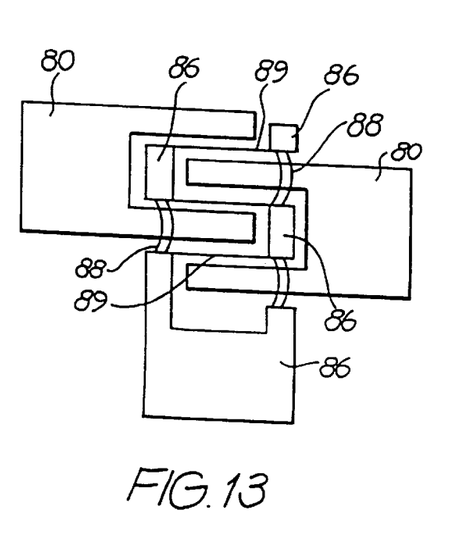
Figure 14:
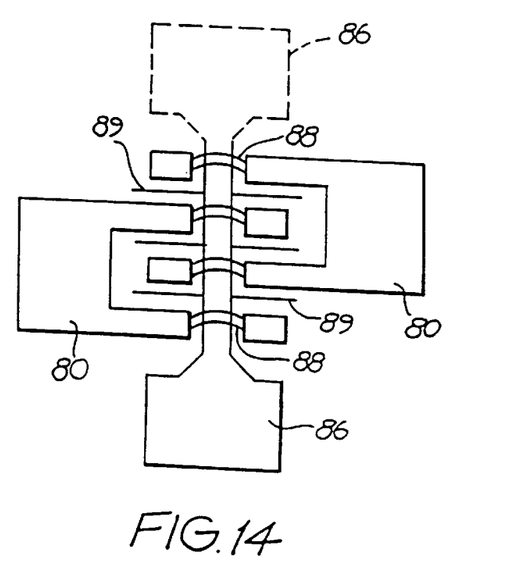

FIGS. 11 to 14 show single gate FET configurations for implementing the invention. The ideal FET configuration for a bi-directional amplifier will be symmetrical with respect to the gate. Such a symmetrical structure enables in-line connection of the source/drain terminals to the input/output circuits and results in equal parasitic access resistances at the source and drain electrodes. The simplest such geometry is illustrated in FIG. 11 and shows source and drain electrodes 80 (both of which can act as either source or drain) symmetrical about a single gate electrode 81 connected to a gate conductor pad 82 to which the gate connection is made. FIG. 12 illustrates a second geometry which differs from that of FIG. 11 in that the gate electrode 83 is connected to two terminals 84, one at each end. This configuration enables the gate resistance to be reduced by grounding each terminal via identical networks. Further gate resistance reduction, by parallel connection of two or more gate fingers 89, can be accomplished by employing geometries similar to those illustrated in FIGS. 13 and 14, in which the drains and sources are again indicated by numeral 80, the gate contacts are indicated by numeral 86, and bridging connections by 88.

In common-gate operation the output impedance of a single gate FET can be negative, depending on the magnitude of its various equivalent circuit elements. A single gate FET for common gate operation will have its equivalent circuit elements (particularly drain-source capacitance) tailored to make the device stable by ensuring non-negative output resistance. Another way of obtaining an intrinsically stable device is by using one or more additional gate electrodes to modify the device equivalent circuit.

The foregoing describes only certain embodiments of the present invention and modifications, obvious to those skilled in the art, can be made thereto without departing from the scope of the present invention.

The lengths of the various transmission lines, other than the two which are approximately λ/4, are preferably optimized to provide the best impedance matching and forward gain response.

While symmetry in the transmission lines is desirable in order to achieve similar forward gain in each direction, the two FET devices need not be identical. For example, a power device and a low noise device can be used. However, in applications requiring symmetrical performance in both directions, such as repeaters, a symmetrical arrangement of the active devices (eg. FETs) is desirable.

Although the described detailed embodiment has two cascaded devices, the invention is applicable to multi-stage amplification so amplifiers with 3, 4 or more stages are also possible.

We claim:

1. A bidirectional amplifier, capable of being symmetrically coupled with a plurality of coupled amplifier stages, comprising:

a field effect type transistor unit with a source and drain, each having an impedance matching device, and a plurality of gates connected in common gate mode, each gate having series capacitive feedback and grounded capacitive reactance; and first and second two-terminal ports each capable of acting as either an input or an output for said amplifier and having a first terminal respectively connected to said source or drain of said transistor unit through said impedance matching device, and a second terminal, wherein each of said second terminals is at least AC connected with one of said gates of said transistor unit.

2. A bidirectional amplifier as claimed in claim 1, wherein said plurality of gates includes at least one gate connected to a gain control voltage.

3. A bidirectional amplifier as claimed in claim 1 wherein the arrangement of the impedance matching devices is symmetrical.

4. A bidirectional amplifier as claimed in claim 1, wherein said transistor unit includes at least two field effect type transistors connected in cascade, said source, drain and gates of said transistor unit corresponding to a source, drain and gates of respective ones of said at least two cascaded transistors.

5. A bidirectional amplifier as claimed in claim 4, wherein at least two of the transistors are connected together by means of a transmission line network which includes a grounded stub.

6. A bidirectional amplifier as claimed in claim 1 wherein the transistor unit is implemented in micro-strip on 50–150 micron thick semi-insulating GaAs substrate.

7. A bidirectional amplifier as claimed in claim 1 wherein a quarter wavelength transmission line is connected in series with the gate of the transistor unit, in order to bring a DC bias voltage to the gate terminal.

8. A transceiver incorporating a bidirectional amplifier comprising:

a field effect type transistor unit with a source and drain, each having an impedance matching device, and a plurality of gates connected in common gate mode, each gate having series capacitive feedback; and first and second two-terminal ports each capable of acting as either an input or an output for said amplifier and having a first terminal respectively connected to said source or drain of said transistor unit through said impedance matching device, and a second terminal, wherein each of said second terminals is at least AC connected with one of said gates of said transistor unit, and said amplifier is capable of being symmetrically coupled with a plurality of coupled amplifier stages.

9. A transceiver as claimed in claim 8, wherein said plurality of gates includes a gate and an additional gate connected to a gain control voltage.

10. A transceiver as claimed in claim 8, wherein an arrangement of said impedance matching device is symmetrical.

11. A transceiver as claimed in claim 8, wherein said transistor unit includes at least two field-effect type transistors connected in cascade, said source, drain and gates of said transistor unit corresponding to a source, drain and gates of respective ones of said at least two cascaded transistors.

12. A transceiver as claimed in claim 8, wherein said transistor unit is implemented in micro-strip on 50–150 micron thick semi-insulating GaAs substrate.

13. A repeater incorporating a bidirectional amplifier comprising:

a field effect type transistor unit with a source and drain, each having an impedance matching device, and a plurality of gates connected in common gate mode, each gate having series capacitive feedback; and first and second two-terminal ports each capable of acting as either an input or an output for said amplifier and having a first terminal respectively connected to said source or drain of said transistor unit through said impedance matching device, and second terminal, wherein each of said second terminals is at least AC connected with one of said gates of said transistor unit, and said amplifier is capable of being symmetrically coupled with a plurality of coupled amplifier stages.

14. A repeater as claimed in claim 13, wherein said plurality of gates includes a gate and an additional gate connected to a gain control voltage.

15. A repeater as claimed in claim 13, wherein an arrangement of the impedance matching device is symmetrical.

16. A repeater as claimed in claim 13, wherein said transistor unit includes at least two field-effect type transistors connected in cascade, said source, drain and gates of said transistor unit corresponding to a source, drain and gates of respective ones of said at least two cascaded transistors.

17. A repeater as claimed in claim 13, wherein said transistor is implemented in micro-strip on 50–150 micron thick semi-insulating GaAs substrate.

* * * * *

UNITED STATES PATENT AND TRADEMARK OFFICE
CERTIFICATE OF CORRECTION

PATENT NO. : 5,821,813
DATED : October 13, 1998
INVENTOR(S) : BATCHELOR et al.

It is certified that error appears in the above-identified patent and that said Letters Patent is hereby corrected as shown below:

On the title page, please insert the following :

--Related U.S. Application Data
[63]   Continuation of international application number PCT/AU94/00704, filed Nov. 16, 1994--

Signed and Sealed this

Eleventh Day of May, 1999

Attest:

Q. TODD DICKINSON

*Attesting Officer*    Acting Commissioner of Patents and Trademarks